United States Patent [19]

Tomasi

[11] 4,276,549

[45] Jun. 30, 1981

[54] FM-CW RADAR DISTANCE MEASURING APPARATUS

[75] Inventor: Jean-Pierre Tomasi, Velizy, France

[73] Assignee: U.S. Philips Corporation, New York, N.Y.

[21] Appl. No.: 94,610

[22] Filed: Nov. 15, 1979

[30] Foreign Application Priority Data

Dec. 26, 1978 [FR] France ............... 78 36312

[51] Int. Cl.³ ............................................. G01S 13/32
[52] U.S. Cl. ....................................... 343/7.5; 343/14
[58] Field of Search ................................... 343/7.5, 14

[56] References Cited

U.S. PATENT DOCUMENTS

| 2,928,085 | 3/1960 | Katz ................................. 343/14 |
| 4,107,679 | 8/1978 | Strauch et al. .................. 343/7.5 |
| 4,151,525 | 4/1979 | Strauch et al. ............... 343/7.5 X |

Primary Examiner—T. H. Tubbesing

[57] ABSTRACT

A FM-CW radar distance measuring apparatus, comprising a feedback loop having a high-frequency signal generator, a mixer device producing a beat signal between the transmitted wave and the received wave, a frequency discriminator, an integrator and a modulator which produces a sawtooth voltage for controlling the generator. The duration of the sawtooth is directly proportional to the distance to be measured. To improve the linearity of the signal to be transmitted a second (digital) feedback loop is provided, connected between the discriminator output and the modulator input and comprising the cascade arrangement of a threshold device, an adder, a store (and a digital-to-analog) converter. A distribution element connects the modulator to the store.

1 Claim, 9 Drawing Figures

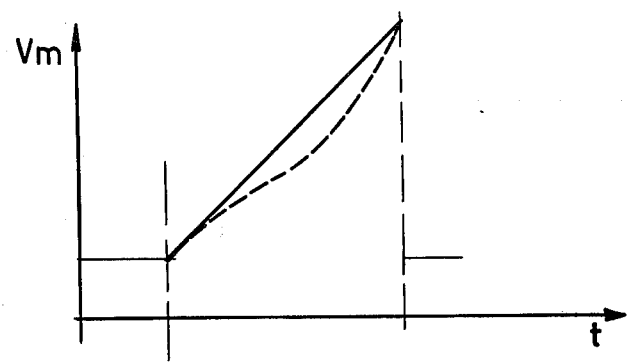
FIG.2a
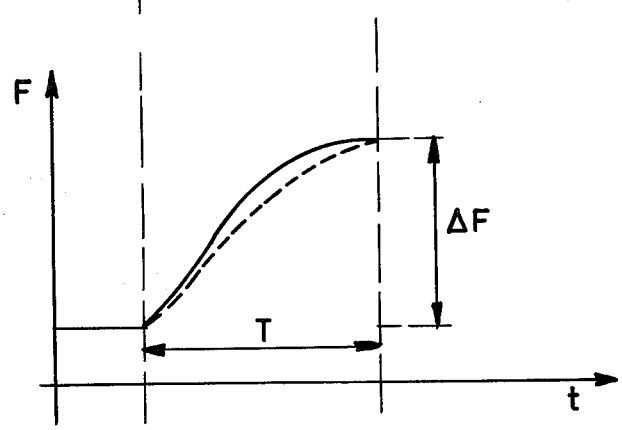
FIG.2b
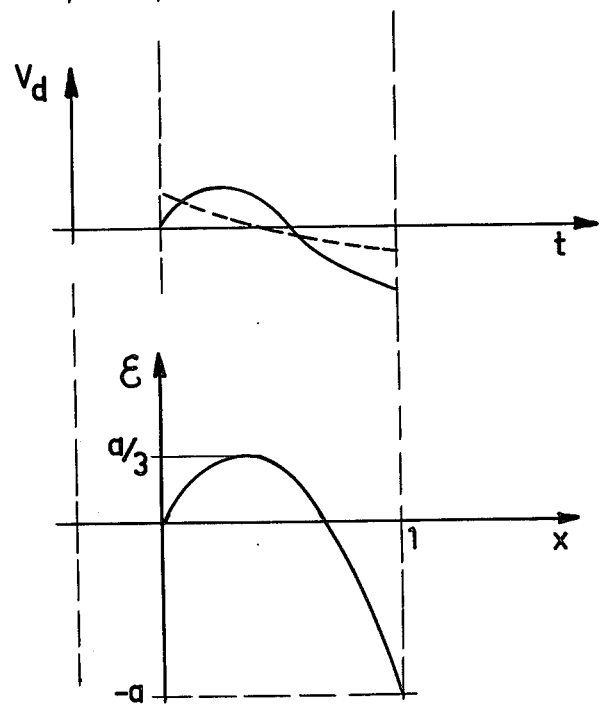
FIG.2c
FIG.2d

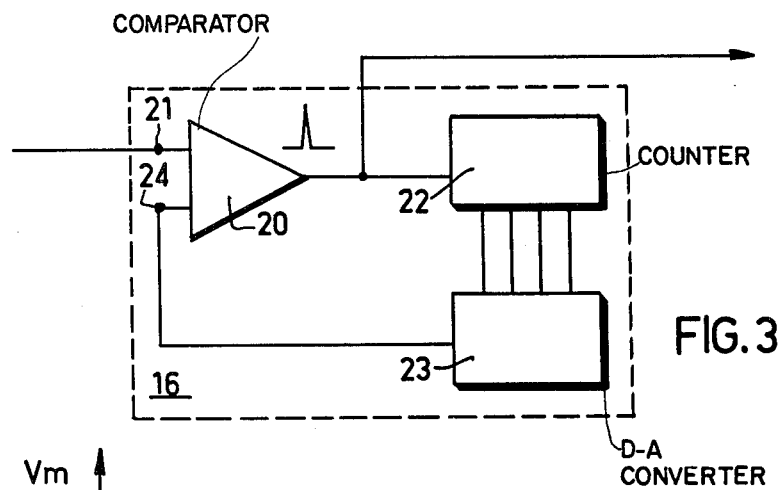
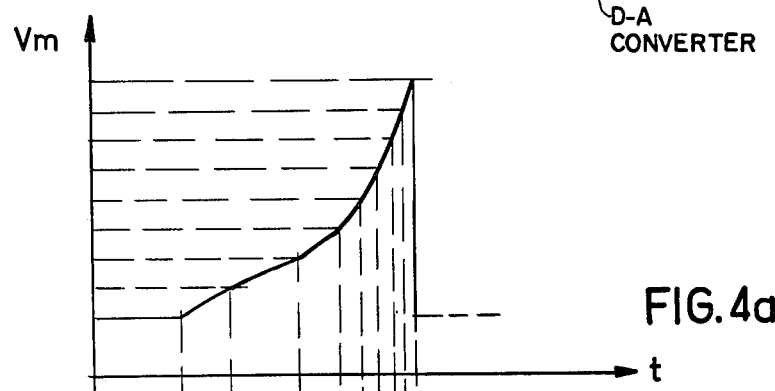
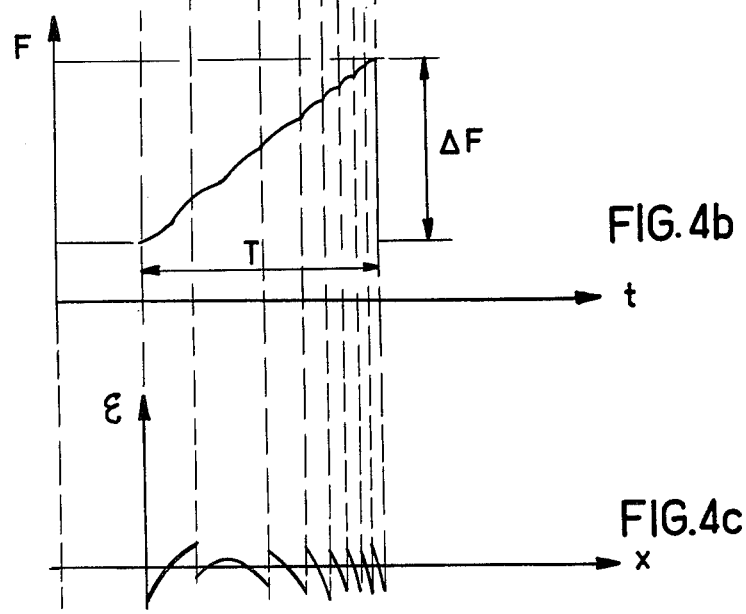

FM-CW RADAR DISTANCE MEASURING APPARATUS

The invention relates to a FM-CW radar distance measuring apparatus, comprising a generator for a high-frequency signal whose frequency is linearly modulated by a modulator generating a sawtooth signal having a variable period T, which is in a linear relationship with the distance to be measured, means for transmitting a high-frequency signal to an object and means for receiving the high-frequency signal reflected from the object, a first feedback loop comprising a mixer stage to which the received signal and the transmitted signal are applied for generating a beat signal having a frequency $f_b$, a frequency discriminator having a central frequency $f_o$ to which the beat signal is applied for generating an error signal which is applied to a first integrator circuit the output of which is coupled to an input of said modulator for adjusting the angle of inclination of the sawtooth signal to make the frequency $f_b$ substantially constant and equal to $f_o$.

As generally known, the accuracy of the distance measurement is influenced to a very high degree by the linearity of the sawtooth voltage generated by the modulator. For the above-described distance measuring apparatus this linearity is not only determined by the action of the modulator itself, but also by the shape of the object from which the transmitted high-frequency signal reflects.

It is an object of the invention to reduce the influence of the shape of the object on the linearity of the sawtooth voltage, thus increasing the accuracy of the distance measurement.

According to the invention this distance measuring apparatus therefore comprises:
(1) a second feedback loop connected to the output of the frequency discriminator and comprising:
- a level detector to which the output signal of the frequency discriminator is applied;
- a second integrator circuit connected to the output of the level detector;
(2) a combiner circuit included between the output of the first integrator circuit and the input of the modulator and arranged for combining the two signals produced by the two integrator circuits;
(3) means for controlling the second integrator circuit and being controlled by the modulator output signal, these means generating within each period of the sawtooth voltage a same number of consecutively occurring control signals for generating a similar number of output signals of the second integration means.

The invention will be further explained by way of non-limitative example with reference to the accompanying drawings.

FIGS. 2a–2d are time diagrams for explaining the operation of the known distance measuring apparatus, FIG. 3 is a block diagram of an embodiment of the control device suitable for use in the distance measuring apparatus shown in FIG. 1.

FIGS. 4a–4c are time diagrams for explaining the operation of the distance-measuring apparatus shown in FIG. 1.

Figure 1:
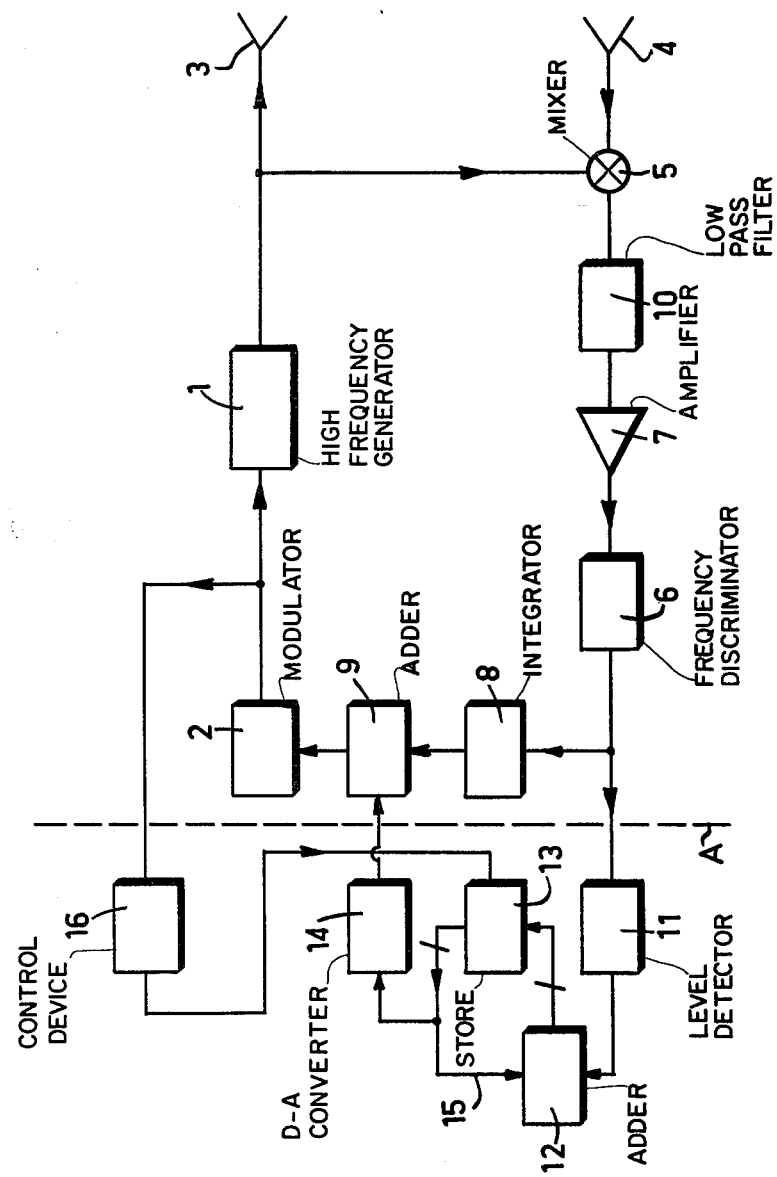
FIG. 1 is a block schematic circuit diagram of the distance measuring apparatus according to the invention.

The portion of FIG. 1 located to the right of the broken line A represents the prior art FM-CW distance meter. It comprises a high-frequency signal generator 1 having a control input which is connected to the output of a modulator 2. This generator 1 produces a high-frequency signal which is transmitted by means of an aerial 3. The reflected signal is received by an aerial 4 and is applied to a mixing stage 5, to which the transmitted signal is also applied thereby producing a difference signal. Via a low-pass filter 10 and an amplifier 7 this difference signal is applied to a frequency discriminator 6 which is tuned to a fixed frequency $f_o$ and produces an error signal whose magnitude is proportional to the deviation of the frequency of the difference signal relative to $f_o$. This error signal is applied to an integrator 8 the output signal of which controls the slope of the sawtooth voltage generated by the modulator 2. If it is assumed that the amplitude of this sawtooth voltage is constant, then its period depends on its slope and, consequently, on the distance D to the object. For this distance D it now holds that:

$$D = \frac{f_o \cdot c}{2 \Delta F} T \qquad (1)$$

Herein
$\Delta F$ represents the constant frequency shift of the high-frequency signal;
c represents the speed of propagation of the electro-magnetic-waves;
T represents the (variable) period of the sawtooth signal.

In addition to the above described elements, which ensure normal functioning of the prior art radar distance meter the feedback loop comprises an adder 9 included between the integrator 8 and the modulator 2, and low-pass filter 10, which is arranged between the mixer stage 5 and the amplifier 7. The operation of these two additional elements will be explained hereinafter. For more detailed information of such a prior art distance measuring apparatus, reference is made to French Pat. No. 1,557,670.

The operation of the distance meter shown in FIG. 1 will be further explained with reference to FIG. 2.

Let it first be assumed that the feedback loop at the output of the frequency discriminator 6 is interrupted. Then the modulator 2 produces an output voltage $V_m$ whose variation is shown by the curve a in FIG. 2a. This variation is assumed to be accurately linear. In response to this output voltage $V_m$ the high-frequency generator 1 produces a high-frequency output signal whose frequency variation is shown by the curve a in FIG. 2b. This last-mentioned curve is not linear and the deviation from the linearity may amount to some tens of percents at certain points. In response to the high-frequency signal generated by the high-frequency generator 1 an output voltage $V_d$, whose variation is shown by the curve a in FIG. 2c is obtained at the output of the frequency discriminator 6.

If now the feedback loop is closed, the output voltage $V_m$ of the modulator, the frequency F of the high-frequency generator and the output voltage $V_d$ of the frequency discriminator 6 will vary as indicated by the curves in the FIGS. 2a, 2b and 2c, respectively, the object being assumed to be punctiform.

It appears that this feedback loop has a linearizing influence on the variation of the frequency of the high-frequency generator 1. This linearizing influence appears to depend on the response time of the feedback loop and is the more pronounced as the response time becomes shorter. The linearizing action thus obtained is, however, insufficient and the deviation of the linearity of the high-frequency generator frequency remains in the order of 27%, whereas a deviation of not more than 5% is acceptable.

It appears, that the deviation from the actual variation of the frequency of the high-frequency generator and the linear variation thereof can be expressed mathematically with a reasonable approximation by the following equation:

$$\epsilon(x) = 2a\,x - 3a\,x^2 \qquad (2)$$

wherein $\epsilon$ is the relative deviation from the desired slope and x is a normalized magnitude which is defined as follows:

$$x = T - \tau/T \text{ where } 0 \leq \tau \leq T$$

Thus, the maximum deviation $\Delta\epsilon$ between the strongest and the weakest slope is equal to:

$$\Delta\epsilon = \epsilon(1/3) - \epsilon(1) = 4/3$$

In expression 2 $a = 0.2$ corresponds to the curve b shown in FIG. 2b for which it then holds that:

$$\Delta\epsilon = 0.27.$$

The large deviation of the linearity of the generator 1 results from the fact that the feedback loop has no store, so that this feedback loop for the linearizing operation recommences before each sawtooth and the time constant of this loop is not sufficiently small to obtain a sufficient linearization therein.

As the above-described deviation of the linearity is systematic and changes only slowly, for example as a function of the temperature, each sawtooth period is divided into a predetermined number of time intervals, each having the same duration, and a number is alotted to each of these time intervals. A signal value which is representative of the deviation from the linearity occurring in that time interval is determined for each of these time intervals and these signal values are stored in a store and read in the time interval having the same number occurring in the next sawtooth period. The signal values thus obtained from the store are added in the adder 9 to the signal produced by the integrator 9 and the sum thus obtained controls the slope of the sawtooth voltage produced by the modulator 2.

To that end the distance meter comprises a second feedback loop which, for the distance meter shown in FIG. 1, is of a digital implementation. Between the output of the frequency discriminator 6 and the second input of the adder 9, this digital loop comprises the cascade arrangement of a level detector 11, an adder 12, a store 13 and an digital-to-analog converter 14. The output of the store 13 is connected to a second input of the adder 12 by means of the conductor 15. A control device 16 is provided between the output of the modulator 2 and a control input of the store 13.

Hereinafter the $i^{th}$ time interval of the p time intervals into which a period T of the sawtooth signal is divided, will be denoted by $J_i$. At each time interval $J_i$ the control device reads a number $M_i$ from the store 13.

The division of the sawtooth voltage $V_m$ into p time intervals $J_i$ is also performed by the control device 16, which for that purpose can be constructed in the manner shown in FIG. 3. The device of FIG. 3 comprises a comparator 20 to which the output signal of the modulator 2 is applied via a first input 21. The output of this comparator 20 is also the output of the control device. This output is further connected to the input of a modulo-p counter 22, whose output is connected to a digital-to-analog converter 23. The output of the converter 23 is connected to a second input 24 of the comparator 20. For the time the voltage at the input 21 is lower than the voltage at the input 24, the comparator 20 produces a first signal voltage. As soon as the voltage at the input 21 exceeds the voltage at the output 24 this comparator produces a second signal voltage in response to which the counting position of the counter 22 increases by one unit and, consequently, the output of the converter 23 by a calibrated voltage step $\delta V$, in response to which the comparator 20 changes back to the first signal voltage, and remains in this position until the signal at the input 21 has increased by the value $\delta V$. The control device thus produces a sequence of second signal voltages or pulses, namely a total of p within each period of the sawtooth voltage $V_m$. As $V_m$ need not have an accurately linear variation, the output pulses of this control device do not appear with a fixed period, so that also the duration of the intervals $J_i$ may differ relative to one another. However, this phenomenon does not affect the proper operation of the distance meter.

The store 13 may be in the form of a shift register consisting of p shift register sections, each being arranged for storing a k-bit word and whose content is shifted under the control of the pulses produced by the control device 16. Now the digital numbers $M_i$ which are coded with k bits appear at the output of this shift register, one of these k bits representing the sign bit of this number. In the time interval $J_i$ the number $M_i$ appearing at the output of the store 13 is applied to a digital-to-analog converter 14. The output signal of this converter 14 is added in the adder 9 to the output signal of the integrator 8 and the sum signal thus obtained controls the slope of the output signal of the modulator 2. The output voltage of the discriminator 6 produced during the time interval $J_i$ is applied to the level detector 11, which compares this output voltage with a positive as well as with a negative threshold voltage, whose absolute values are equal to one another. This detector produces a logic signal which is equal to $+1$, 0 or $-1$, respectively, depending on whether the input voltage is higher than the positive threshold voltage, is located between the two threshold voltages or is lower than the negative threshold voltage. These functions can be realized in known manner with two comparison devices. The output number, $+1$, 0 or $-1$ is algebraically added to the number $M_i$ by means of the adder 12 and the result is again applied to the shift register (store). During the time interval $J_{i+1}$ the store supplies the number $M_{i+1}$ which, in like manner as $M_i$, is increased or reduced by one unit or is kept constant. Finally, during the time interval $J_p$ the number $M_p$ appears at the output of the store.

Level detector 11 is therefore a means for converting the analog signals from frequency discriminator 6 into three level signals that are integrated by a sampling type of digital integration constituted by adder 12, store 13, digital-to-analog converter 14 and control device 16. Each time a pulse is generated by control device 16 the store 13 and adder 12 add the +1, 0 or −1 signal from level detector 11 to the signal value in store 13, thus effecting a digital integration of the output from level detector 11. The sampling rate is set by control device 16 in response to the slope of the sawtooth wave from modulation 2 and increases in response to an increase in the sawtooth wave slope.

Instead of being implemented as a shift register, the store 13 may alternatively be constituted by a storage medium, for example a RAM with addressable storage locations, it being possible to store one of the p numbers, consisting of k bits, in each of these storage locations. In that case the content of the modulo-p-counter 22 is applied as address code to the store 13, instead of the output pulses of the comparator 20 shown in FIG. 3. It will be apparent from the following example that the above-described measures have the desired effect. Starting from the expression for $\epsilon(x)$ in equation (2), then it holds that the change $\delta\epsilon$ of $\epsilon(x)$ is defined by the expression $\delta\epsilon = 2a - 6ax$, so that at an interval of length p the average change of is equal to:

$$\overline{\delta\epsilon} = (2a - 6ax)1/p$$

The maximum value $\overline{|\delta\epsilon|}$ occurring in the first time interval, notably for $x=1$, is equal to $4a/p$. For $a=0.2$ and $p=16$ it then holds that:

$$4a/p = 0-05$$

which means in practice a 5% deviation from the linearity.

FIGS. 4a–4c illustrate the effect of the digital feedback loop on the modulator 2 and the generator 1. Herein p is chosen equal to 8. More particularly, FIG. 4a represents the output voltage $V_m$ of the modulator 2. This curve, shown in FIG. 4a, is formed by means of 8 linear segments having a given slope, a discrete slope transient occurring at the transition from one segment to the other.

FIG. 4b shows the variation of the frequency of the high-frequency generator in response to the output voltage, shown in FIG. 4a of the modulator.

The deviation from the linearity $\epsilon(x)$ of the curve, shown in FIG. 4b, is shown in FIG. 4c.

What is claimed is:

1. An improved FM-CW radar distance measuring apparatus, of the type comprising means for generating a high-frequency signal whose frequency is linearly modulated by a modulator generating a sawtooth signal having a variable period T, the period T being in a linear relationship with the distance to be measured, means for transmitting the high-frequency signal to an object and means for receiving the high-frequency signal reflected from the object, a first feedback loop comprising a mixer stage to which the received signal and the transmitted signal are applied for generating a beat signal having a frequency $f_b$, a frequency discriminator having a central frequency $f_o$ to which the beat signal is applied for generating an error which is applied to a first integrator circuit, the output of said first integrator circuit being coupled to an input of said modulator for adjusting the angle of inclination of the sawtooth signal for rendering the frequency $f_b$ substantially constant and equal to $f_0$, the improvement which comprises:

(1) a second feedback loop connected to the output of the frequency discriminator and comprising:
 a level detector to which the output signal of the frequency discriminator is applied;
 a second integration circuit, connected to the output of the level detector said second integration circuit being a sampling-type digital integrator;

(2) combining circuit means connected to the output of the first integration circuit and the input of the modulator for combining the output signals produced by the two integration circuits;

(3) means connected to the output of the modulator for controlling the sampling rate of the second integration circuit by generating within each period of the sawtooth voltage an equal number of consecutively occurring control signals where the frequency of the control signals increases with increasing slope of the sawtooth signal.

* * * * *